(12) United States Patent
Blanchard et al.

(10) Patent No.: US 9,123,705 B2
(45) Date of Patent: Sep. 1, 2015

(54) CONDUCTIVE INK FOR FILLING VIAS

(71) Applicant: Nthdegree Technologies Worldwide Inc., Tempe, AZ (US)

(72) Inventors: Richard A. Blanchard, Los Altos, CA (US); William J. Ray, Fountain Hills, AZ (US); Mark D. Lowenthal, Gilbert, AZ (US); Xiaorong Cai, Mount Pleasant, SC (US); Theodore Kamins, Palo Alto, CA (US)

(73) Assignee: Nthdegree Technologies Worldwide Inc., Tempe, AZ (US)

( * ) Notice: Subject to any disclaimer, the term of this patent is extended or adjusted under 35 U.S.C. 154(b) by 0 days.

(21) Appl. No.: 14/552,212

(22) Filed: Nov. 24, 2014

(65) Prior Publication Data

US 2015/0076711 A1    Mar. 19, 2015

Related U.S. Application Data

(62) Division of application No. 14/075,089, filed on Nov. 8, 2013, now Pat. No. 8,940,627.

(60) Provisional application No. 61/824,292, filed on May 16, 2013, provisional application No. 61/754,868, filed on Jan. 21, 2013, provisional application No. 61/727,909, filed on Nov. 19, 2012.

(51) Int. Cl.
*H01L 23/00* (2006.01)
*H01L 23/48* (2006.01)
(Continued)

(52) U.S. Cl.
CPC ............ *H01L 23/481* (2013.01); *H01L 21/288* (2013.01); *H01L 21/486* (2013.01); *H01L 21/76879* (2013.01); *H01L 21/76882* (2013.01); *H01L 21/76898* (2013.01); *H01L 23/49827* (2013.01); *H01L 23/5226* (2013.01); *H01L 23/5328* (2013.01); *H01L 24/08* (2013.01); *H01L 24/19* (2013.01); *H01L 24/80* (2013.01); *H01L 24/94* (2013.01); *H01L 25/0657* (2013.01); *H01L 25/50* (2013.01); *H01L 24/05* (2013.01); *H01L 24/06* (2013.01); *H01L 2224/03002* (2013.01); *H01L 2224/0332* (2013.01); *H01L 2224/0557* (2013.01); *H01L 2224/05568* (2013.01); *H01L 2224/06181* (2013.01); *H01L 2224/08146* (2013.01);
(Continued)

(58) Field of Classification Search
CPC ................ H01L 23/49827; H01L 23/5226; H01L 23/481
See application file for complete search history.

(56) References Cited

U.S. PATENT DOCUMENTS 4,474,659 A    10/1984    Fazlin
5,151,377 A     9/1992    Honoka et al.
(Continued)

*Primary Examiner* — Ngan Ngo
(74) *Attorney, Agent, or Firm* — Patent Law Group LLP; Brian D. Ogonowsky

(57) ABSTRACT

Vias (holes) are formed in a wafer or a dielectric layer. A low viscosity conductive ink, containing microscopic metal particles, is deposited over the top surface of the wafer to cover the vias. An external force is applied to urge the ink into the vias, including an electrical force, a magnetic force, a centrifugal force, a vacuum, or a suction force for outgassing the air in the vias. Any remaining ink on the surface is removed by a squeegee, spinning, an air knife, or removal of an underlying photoresist layer. The ink in the vias is heated to evaporate the liquid and sinter the remaining metal particles to form a conductive path in the vias. The resulting wafer may be bonded to one or more other wafers and singulated to form a 3-D module.

15 Claims, 7 Drawing Sheets

(51) Int. Cl.
*H01L 21/768* (2006.01)
*H01L 21/288* (2006.01)
*H01L 25/065* (2006.01)
*H01L 25/00* (2006.01)
*H01L 23/498* (2006.01)
*H01L 21/48* (2006.01)
*H01L 23/522* (2006.01)
*H01L 23/532* (2006.01)

(52) U.S. Cl.
CPC ........ *H01L2224/08165* (2013.01); *H01L 2224/73265* (2013.01); *H01L 2224/76155* (2013.01); *H01L 2224/83191* (2013.01); *H01L 2224/94* (2013.01); *H01L 2225/06513* (2013.01); *H01L 2225/06517* (2013.01); *H01L 2225/06572* (2013.01)

(56) References Cited

U.S. PATENT DOCUMENTS

| | | |
|---|---|---|
| 5,178,934 A | 1/1993 | Kellerman |
| 2003/0178138 A1* | 9/2003 | Tsukagoshi et al. .......... 156/326 |
| 2004/0129937 A1* | 7/2004 | Hirai ............................ 257/40 |
| 2008/0286488 A1 | 11/2008 | Li et al. |
| 2010/0047955 A1 | 2/2010 | Vijh |
| 2012/0049384 A1 | 3/2012 | Yaniv et al. |
| 2012/0178194 A1 | 7/2012 | Ray et al. |
| 2013/0000964 A1* | 1/2013 | Kobayashi et al. .......... 174/257 |
| 2013/0334470 A1* | 12/2013 | Kurihara et al. ............. 252/514 |
| 2014/0138846 A1 | 5/2014 | Blanchard et al. |
| 2014/0175481 A1* | 6/2014 | Tischler ........................ 257/98 |
| 2014/0231848 A1 | 8/2014 | Tischler et al. |

* cited by examiner

CONDUCTIVE INK FOR FILLING VIAS

CROSS-REFERENCE TO RELATED APPLICATIONS

This is a divisional application based on, and claiming priority from, U.S. application Ser. No. 14/075,089, filed on Nov. 8, 2013, which is based on U.S. provisional application Ser. No. 61/727,909, filed on Nov. 19, 2012; U.S. provisional application Ser. No. 61/754,868, filed on Jan. 21, 2013; and U.S. provisional application Ser. No. 61/824,292, filed on May 16, 2013, all incorporated herein by reference.

FIELD OF THE INVENTION

This invention relates to the processing of substrates, such as those used for forming integrated circuit (IC) chips, and, in particular, to a method of filling vias during processing such substrates.

BACKGROUND

In IC manufacturing where there is a high density of components (e.g., transistors) formed in a substrate (such as a silicon wafer), it is sometimes desirable to interconnect the components using a multi-tier grid of traces. After the components are formed in the substrate, a first thin dielectric layer is formed and patterned to expose contact areas of the components. The openings in the dielectric are then filled with a conductive material, such as aluminum, to form a first tier conductor layer. Horizontal metal traces with vertical "via plugs" may be formed to interconnect the components. Due to the high density of components, providing routing between components without the conductors intersecting may be impractical. Therefore, a second dielectric layer is formed over the first tier conductor layer and patterned to form vias (holes) extending to either the silicon or to conductors in the first tier conductor layer. The vias are then filled with a conductive material (e.g., aluminum) to form vertical interconnections, and another set of horizontal metal traces are formed. There may be more layers of both horizontal and vertical conductors, depending on the complexity of the required interconnects.

In another application for vias, components are formed in a first silicon wafer. Through-Silicon-Vias (TSV's) are etched through the silicon, and the vias are filled with a conductive material to form conductive paths extending between opposing surfaces of the silicon wafer. The vias, if sufficiently large, are typically filled using PVD, CVD, sputtering, plating, or printing a conductive paste. In some cases, the vias only extend part way through the silicon, and the silicon is then thinned (e.g., by CMP) to cause the vias to extend through the wafer. Another wafer or multiple wafers have their electrodes aligned with the conductive vias and the wafers are then bonded together, where the vias create a vertical conductive path through one or more wafers to interconnect components on different wafers to form a 3-D module. The bonded wafers are then diced and packaged. Such TSV's allow wafers formed using very different technologies to be interconnected near the end of the manufacturing flow to create compact 3-D modules after singulation.

A passive interposer wafer may also be fabricated with a pattern of metal-filled vias that extend from the top surface to the bottom surface. The interposer is then sandwiched between two other wafers to electrically connect components on the two wafers.

As the density of components increases, the diameters of the vias must decrease, such as to a few microns. One conventional metal deposition technique is sputtering. Due to the shadow effect, for narrow vias, only the sputtered metal particles that have a trajectory approximately normal to a via opening fill the via. The acceptable angles are reduced as the depths of the vias are increased. The angle of impact of the metal particles is essential random. Hence, there is a relatively high likelihood of open circuits and low yields. Sputtering is a relatively expensive process, with considerable waste of material and the requirement for a vacuum chamber. Other deposition processes, such as plating a seed layer, suffer from the same or additional drawbacks. One common drawback is that the top portion of a via gets clogged with the deposited metal, preventing additional metal from filling the bottom of the vias.

Additionally, there is strain introduced by the mismatch in thermal coefficients of expansion (TCE) of the metal and the silicon, which may lead to cracking.

The same issues regarding vias apply to non-silicon applications.

What is needed is an improved technique for filling vias that is less expensive and more reliable. Additionally, it is desirable to reduce the minimum size of a via to increase the silicon surface area used for forming components.

SUMMARY

A medium or low viscosity conductive ink is used to fill vias in substrate fabrication processes. A conductive ink may be formed by providing a metal powder having a desired average grain size (diameter). Preferably, the grains are highly conductive, such as aluminum, copper, silver, or alloys thereof, and are sinterable at suitable temperatures that do not adversely affect other components on the wafer. Non-metal conductive particles may also be used. The conductive particles may be on the order of 1-10 microns in diameter and are suspended in a solution, such as alcohol or other low viscosity organic solvent that evaporates with heat.

In the methods illustrated by the figures, vias are formed through either dielectric layers or through a semiconductor wafer or other substrate, and various ways are described for forcing the ink into the vias.

In one embodiment, a wafer containing vias is supported by a tool providing a raised lip around the wafer. Or the raised lip can be a photoresist wall. Conductive ink is then deposited over the entire surface of the wafer. The conductive ink is then forced into the narrow vias using any of a number of methods.

In one embodiment, the wafers are mounted on a vertical centrifuge, which forces the ink into the vias to displace the remaining air.

In another embodiment, the conductive particles in the ink comprise a core of a ferrous material or a high mu (magnetic permeability) material such as a NiFe alloy. The core is then coated with a good conductor material, such as aluminum, copper, silver, or alloys thereof. After the conductive ink is coated over the wafer, a magnetic field is applied to pull the ink into the vias.

In another embodiment, the wafer is heated to expand the air in the vias, and the expanded air escapes though the conductive ink. When the wafer is cooled, the ink fills the vias and displaces the remaining air.

The above methods of filling the vias may be performed on vias that do not extend completely though the structure. If the vias extend completely through the structure, the structure may be mounted on a filter sheet that blocks the metal particles from exiting the via. A vacuum is then applied to the bottom surface of the filter sheet to draw the air and solvent out of the vias. When the filter sheet is removed from the structure, the conductive particles remain in the vias. Optionally, only the air is drawn out of the vias, causing the ink to fill the vias. A centrifuge or magnetic field may also be used to draw the metal particles into the vias.

The structure is then heated to evaporate the solvent and sinter the metal particles together.

Prior to or after the heating step, excess ink on the surface of the wafer is removed. In one embodiment, the excess ink is squeegeed off. In another embodiment, a thin, non-wettable photoresist layer is deposited on the wafer surface prior to the ink being deposited. After the ink fills the holes, the photoresist is dissolved and removed along with any overlying ink.

In one embodiment, the conductive ink is 20-40% solid material. With available conductive inks, cylindrical vias as narrow as 10 microns may be completely filled with the conductive inks. With optimized inks, containing smaller metal particles, smaller vias can be filled, such as 1-5 microns in diameter. The present process can fill vias of virtually any depth since there is no shadow effect, unlike for sputtering. The process can be performed at atmospheric pressures, making it an inexpensive process. No etching of the ink is needed after the process.

Other embodiments are described in the detailed description. All steps may be performed under atmospheric pressure conditions.

BRIEF DESCRIPTION OF THE DRAWINGS

Elements that are similar or identical in the various figures are labeled with the same numeral.

DETAILED DESCRIPTION

In one embodiment, the conductive ink may be formed by providing a metal powder having an average grain size (diameter) between 1-10 microns. Aluminum, copper, or silver grains (or alloys thereof) are used in one embodiment. Non-metal conductive particles are also envisioned. Forming conductive grains of any average diameter is well known. Methods for forming metal particles include spraying (misting) molten metal and cooling the particles, or simply using particles resulting from grinding a metal bar followed by separating the particles according to size using well-known techniques. By controlling the parameters of the process, such as the fineness of the grinder, metal particles of virtually any size may be formed, such as down to a few tenths of a micron.

The conductive particles are then dispersed in a solution, such as alcohol or another organic solvent. The small sizes of the particles (typically 1-10 microns in diameter) prevent the particles from settling due to Brownian motion. The solution (containing the particles) preferably has a medium viscosity in the range of 100-1200 centipoise (cP). In contrast, water has a viscosity of about 1 cP. The viscosity may be less when heated and may be controlled to be optimal by heating.

Via openings greater than 100 um may only need gravity or a squeegee force to cause the ink to displace the air in the vias and overcome the frictional forces, depending on the viscosity of the ink and the depth of the hole. A hole through a thick substrate may need to be larger for gravity to fill the hole with ink. However, via openings less than about 100 um may not be automatically filled with the ink (assuming the conductive particle sizes are smaller than the openings) due to the friction of the ink with the surfaces, surface tension, and the air occupying the vias. Accordingly, as part of the inventive process, various ways are described for forcing the ink into the vias.

Figure 1:
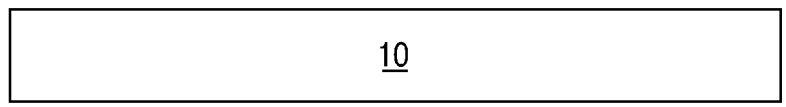
FIG. 1 is a simplified cross-sectional view of a small portion of a semiconductor wafer, such as a silicon wafer. The wafer may contain electronic components.

FIG. 1 is a simplified cross-sectional view of a small portion of a semiconductor wafer 10, such as a silicon wafer. The wafer 10 may contain electronic components.

Figure 2:
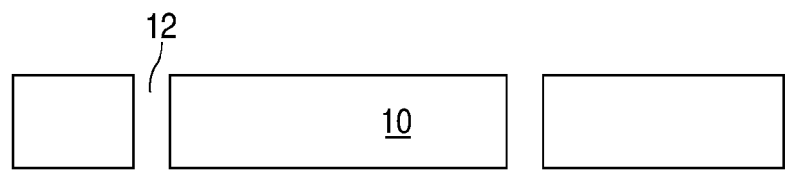
FIG. 2 illustrates the wafer of FIG. 1 with vias (holes) etched through the wafer and a dielectric, such as silicon dioxide, grown or deposited on the via walls.

FIG. 2 illustrates vias 12 etched through the wafer 10. Etching may be performed using a plasma (e.g., using reactive ion etching), with the wafer 10 masked by conventional techniques.

If the wafer 10 is a semiconductor, a dielectric, such as silicon dioxide, is then grown or deposited on the via walls.

Figure 3:
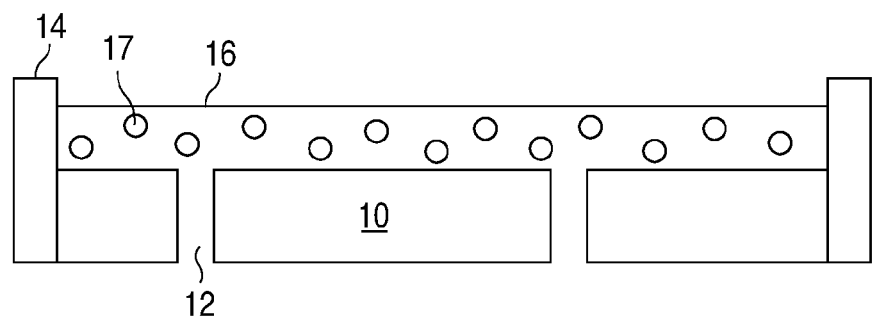
FIG. 3 illustrates the wafer of FIG. 2 with the wafer mounted in a tool for filling the vias with a low viscosity conductive ink, and the conductive ink deposited over the wafer.

FIG. 3 illustrates the wafer 10 mounted in a tool 14 for filling the vias 12 with a low viscosity conductive ink 16. The ink 16 is then deposited over the wafer 10 such as by spraying or printing. Conductive particles 17 in the ink are illustrated. The ink 16 is retained within the raised lip of the tool 14.

Figure 4:
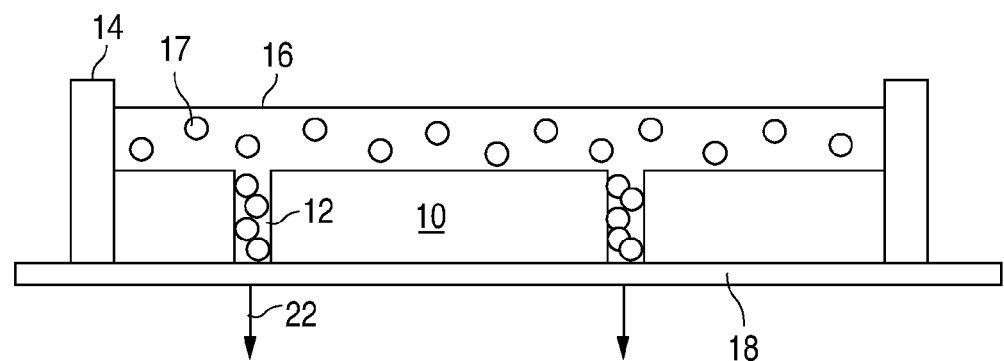
FIG. 4 illustrates the structure of FIG. 3 while either a magnetic field, a centrifugal force, a vacuum, or suction after outgassing the air in the vias draws the ink into the vias. A filter sheet blocks the conductive particles from exiting the vias.

FIG. 4 illustrates a filter sheet 18 affixed on the bottom surface of the wafer 10. The filter sheet 18 has holes (webbing) with diameters smaller than the sizes of the conductive particles 17 in the ink 16. The sheet 18 blocks the metal particles from exiting the vias 12 but allows air and the solvent to pass through. Such filters with any size holes are commercial available, such as from Millipore Corporation.

A magnetic field, a centrifugal force, or a vacuum is then applied to the wafer 10, all illustrated by the force 22 pulling the ink 16 into the vias 12. A top-down high pressure, such as air pressure or a mechanical force, may also be applied to force the ink 16 into the vias 12.

For a magnetic field to draw the conductive particles 17 into the vias 12, the conductive particles 17 must contain iron or other metal with magnetic permeability, such as a NiFe alloy. Such particles may be fabricated using conventional methods. If increased conductivity is desired, or certain sintering properties are desired, the magnetic particles may be coated with another metal, such as aluminum, copper, silver, or a suitable alloy. The magnetic field may be generated by a permanent magnet located below the wafer 10 or by an electromagnetic located below the wafer 10.

If the wafer 10 is sufficiently heated, the air in the vias 12 will expand and be transported out through the ink 16 layer. Upon cooling the wafer 10, the ink 16 will be drawn into the vacuum of the vias 12. Therefore, no external force 22 needs to be applied. When using such a method, the filter sheet 18 may be replaced by a temporary sealing sheet.

During the various processes to force the ink 16 into the vias, the wafer 10 may be heated. This heating typically reduces the viscosity of the solvent. The viscosity of water at room temperature is approximately 1 centipoise (cP). The viscosity of acetone is approximately 0.3 cP at room temperature, and the viscosity of alcohol may be as low at about 0.5 cP at room temperature. The viscosity of the solution containing the conductive particles is much higher than the solvent viscosity. Heating to 100° C. may lower the viscosity to about 25% of the room temperature viscosity.

Once the ink 16 has filled the vias 12, any remaining ink 16 on the wafer 10 surface is squeegeed off, spun off, removed with an air knife, or otherwise removed, and the wafer 10 is heated for a time to evaporate the solvent in the ink 16. Only conductive particles 17 remain in the vias 12. (In practice, there may be some residual conductive particles 17 remaining on the surface of the wafer 10 that will not affect the performance of the resulting device.) The temperature of the wafer 10 is then elevated to a sufficient temperature to sinter the conductive particles 17 together to achieve good electrical conduction through the vias 12.

The sizes of the conductive particles 17 in the ink 16 are preferably selected to have an optimal average diameter. The sheet resistance of a conductive sheet formed of conductive particles is lower with larger particles due to fewer particle-to-particles interfaces (with each interface adding resistance). However, the sizes of the particles cannot be larger than the via openings. Therefore, there is a tradeoff involving particle size and performance.

Figure 5:
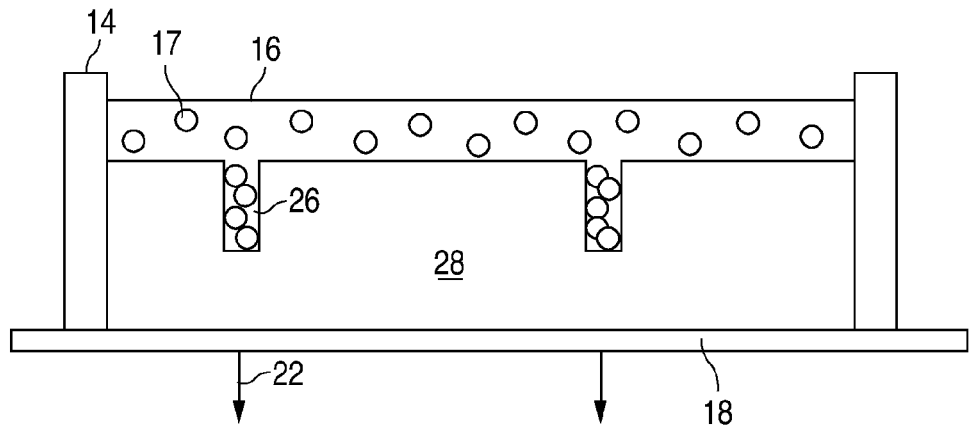
FIG. 5 illustrates another embodiment where the vias are not completely etched through the wafer and where the insulated vias are filled with the conductive ink using either a magnetic field, centrifugal force, or other means. The wafer is ultimately thinned, such as by chemical-mechanical polishing (CMP), grinding, or other means to cause the conductive vias to extend completely through the wafer.

FIG. 5 illustrates an embodiment where the vias 26 are not completely etched through the wafer 28. A dielectric is grown or deposited on the via 26 walls. The insulated vias 26 are then filled with the conductive ink 16 using either a magnetic field, centrifugal force, or other means, as described with respect to FIG. 4.

The wafer 28 is then removed from the tool 14, the remaining ink 16 is squeegeed off the surface (or removed by other means mentioned above), the solvent is evaporated, and the conductive particles 17 are sintered together, as described above.

The wafer 28 is then thinned, such as by chemical-mechanical polishing (CMP), grinding, or other means to cause the conductive vias 26 to extend completely through the wafer 28.

Figure 6A:
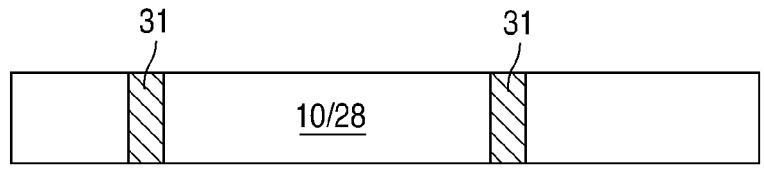
FIG. 6A illustrates the resulting wafer of FIG. 4 or 5 after the remaining conductive ink is squeegeed off the top of the wafer (or removed by other means) and after heating steps to cause the solvent in the conductive ink to evaporate and the metal particles to be sintered together.

FIG. 6A illustrates the resulting wafer 10 (FIG. 4) or 28 (FIG. 5) after the conductive particles 17 have been sintered together to form conductive vias 31.

Figure 6B:
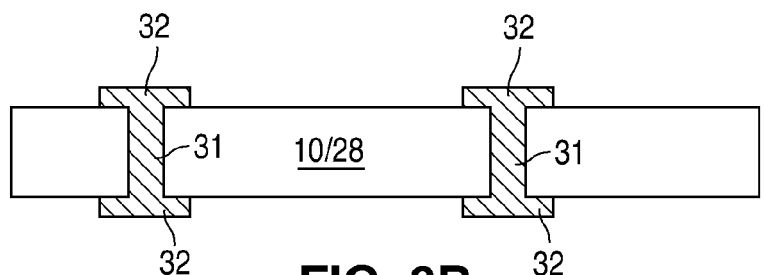
FIG. 6B illustrates the wafer of FIG. 6A where the vias are optionally terminated with metal electrodes, which may be formed by printing conductive ink or formed by conventional techniques.

In FIG. 6B, the conductive vias 31 are then optionally terminated with metal electrodes 32, which may be formed by printing conductive ink (or paste) or formed by other conventional techniques. Screen printing may be used for forming the electrodes 32. Alternatively, the conductive vias 31 may be interconnected by a patterned metal layer on one or both surfaces of the wafer 10/28. For high density applications, the metal layer may be formed by conventional photolithographic processes.

Figure 7:
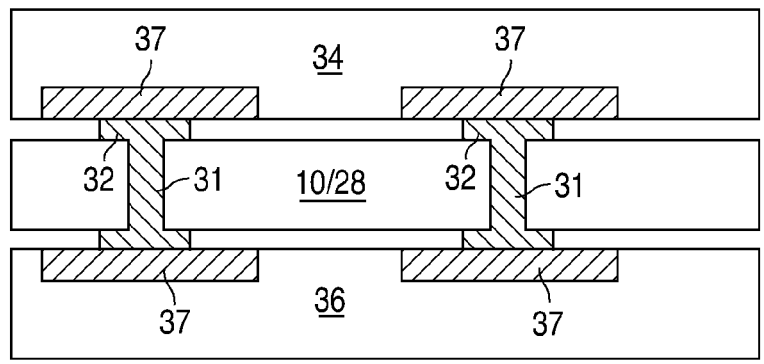
FIG. 7 illustrates the wafer of FIG. 6B after being bonded to two other wafers containing electronic components that are interconnected by the vias. The middle wafer may also contain electronic components. The wafer of FIG. 6A could have been used instead.

FIG. 7 illustrates the wafer 10/28 after its electrodes 32 are bonded to aligned electrodes of two other wafers 34 and 36 containing electronic components 37 that are interconnected by the conductive vias 31. The wafer 10/28 may also contain electronic components connected to the vias 31. The wafer 10/28 may act as an interposer to reroute signals between electrodes on the top and bottom of the wafer 10/28. Alternatively, the wafer of FIG. 6A may be used, where bonding is made directly to the conductive vias 31.

Figure 8:
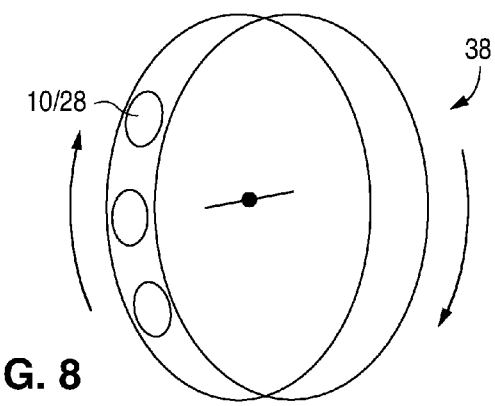
FIG. 8 illustrates the use of a vertical centrifuge on which one or more wafers are mounted to force the conductive ink into the vias, such as during the step illustrated in FIG. 4 or 5. A horizontal centrifuge may be used instead.

FIG. 8 illustrates the use of a vertical centrifuge 38 on which one or more wafers 10/28 are mounted to force the conductive ink 16 into the vias by centrifugal force, such as during the step illustrated in FIG. 4 or 5. A horizontal centrifuge may also be used.

Figure 9:
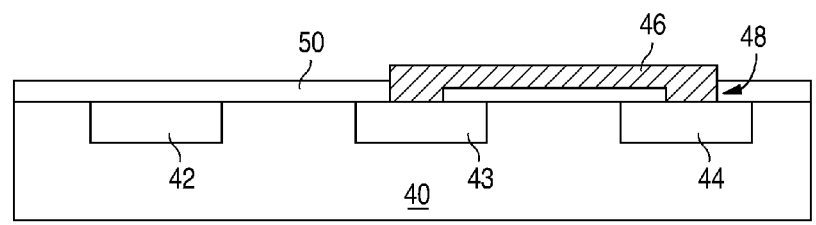
FIG. 9 illustrates another use of the invention and shows a simplified cross-sectional view of a small portion of a semiconductor wafer incorporating three components, such as resistors, diodes, transistors, etc., where two of the components are electrically connected together with a patterned first tier metal layer extending through vias in a first dielectric layer.

FIG. 9 illustrates another use of the invention and shows a simplified cross-sectional view of a small portion of a semiconductor wafer 40 incorporating three components 42, 43, and 44, such as resistors, diodes, transistors, etc., where the components 43 and 44 are electrically connected together with a patterned first tier metal layer 46 extending through vias 48 in a first dielectric layer 50. The vias 48 and metal layer 46 may be formed by conventional photolithographic techniques. The vias 48 and metal layer 46 may be instead formed using the conductive ink techniques described with respect to FIGS. 3-5.

Figure 10:
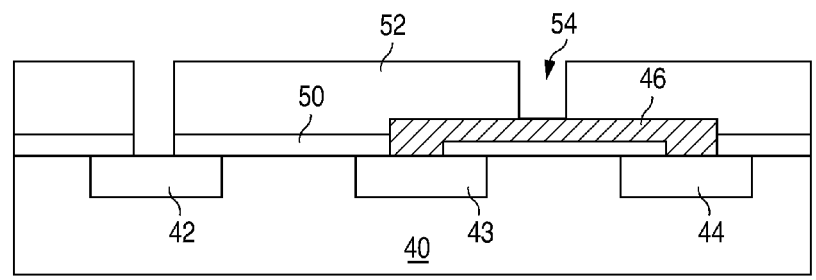
FIG. 10 illustrates the wafer of FIG. 9 with vias etched through a second dielectric layer.

FIG. 10 illustrates a second dielectric layer 52 formed over the wafer 40, where vias 54 are etched through the second dielectric layer 52 for exposing the metal layer 46 and the component 42 for ultimately interconnecting them.

Figure 11:
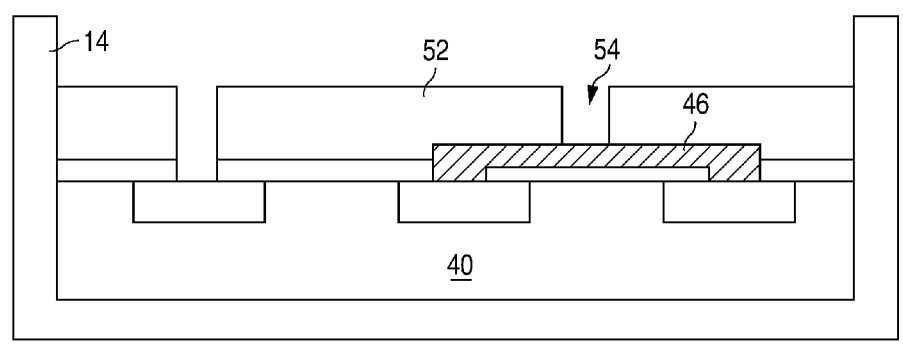
FIG. 11 illustrates the wafer of FIG. 10 mounted in a tool for filling the vias with a conductive ink.

FIG. 11 illustrates the wafer 40 mounted in a tool 14 for filling the vias 54 with a conductive ink.

Figure 12:
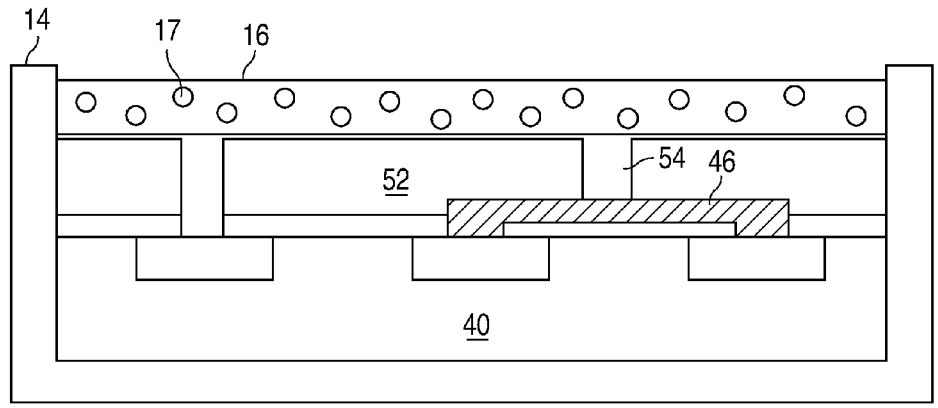
FIG. 12 illustrates the wafer of FIG. 11 after a low viscosity conductive ink has been deposited over the wafer.

FIG. 12 illustrates the low viscosity conductive ink 16 deposited over the wafer 40 and retained within the raised lip of the tool 14.

Figure 13:
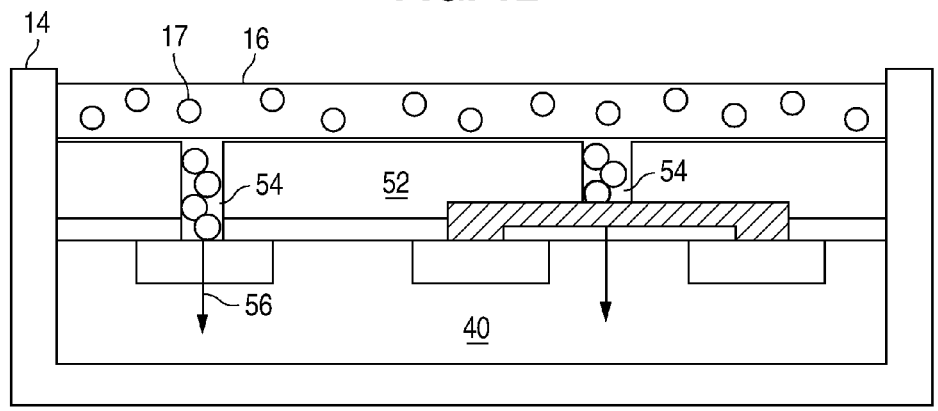
FIG. 13 illustrates the wafer of FIG. 12 while a magnetic field, centrifugal force, or suction after outgassing the air in the vias draws the ink into the vias.

FIG. 13 illustrates a magnetic field, centrifugal force, or suction after outgassing the air in the vias 54 drawing the ink 16 into the vias 54. The downward pulling force 56 from any source is shown. A magnet 57 is shown in an embodiment where the conductive particles 17 have magnetic permeability. Alternately, there may be a top down force pushing down on the ink 16 for filling the vias 54 and displacing the air in the vias 54.

Figure 14:
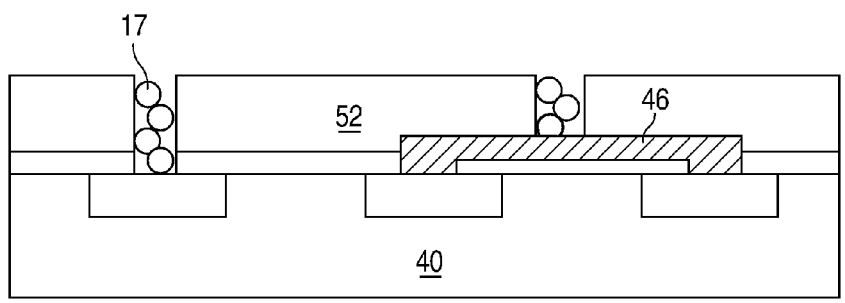
FIG. 14 illustrates the wafer of FIG. 13 after the remaining ink is squeegeed off the top surface of the wafer and the wafer is removed from the tool.

FIG. 14 illustrates the remaining ink having been squeegeed off the top surface of the wafer 40 and the wafer 40 having been removed from the tool 14.

Figure 15:
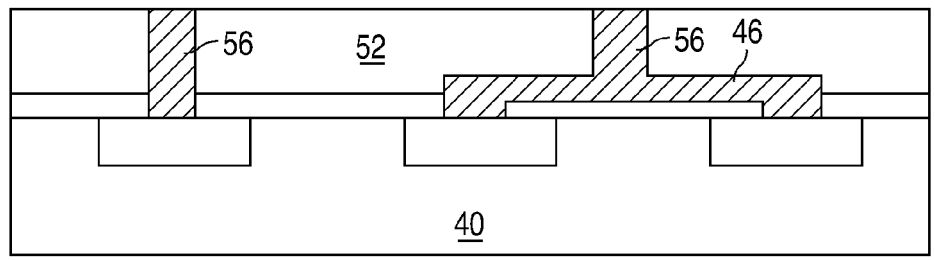
FIG. 15 illustrates the wafer of FIG. 14 after the wafer is heated to evaporate the solvent at a first temperature and after the remaining metal particles are heated to sinter the metal particles together at an elevated temperature.

FIG. 15 illustrates the wafer 40 after being heated to a first temperature to evaporate the ink solvent and after the remaining metal particles 17 are heated to sinter the conductive particles 17 together at an elevated temperature. The resulting conductive vias 56 extend to the top surface of the second dielectric layer 52.

Figure 16:
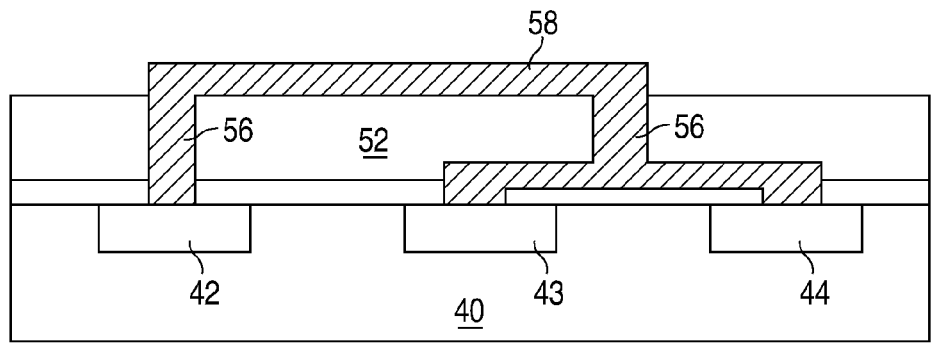
FIG. 16 illustrates the wafer of FIG. 15 after a second-tier metal layer is patterned on the surface of the second dielectric layer to interconnect the metal in the vias.

FIG. 16 illustrates a second-tier metal layer 58 deposited and patterned on the surface of the second dielectric layer 52 to interconnect the conductive vias 56. The metal layer 58 may be formed by screen printing or other deposition method.

Figure 17:
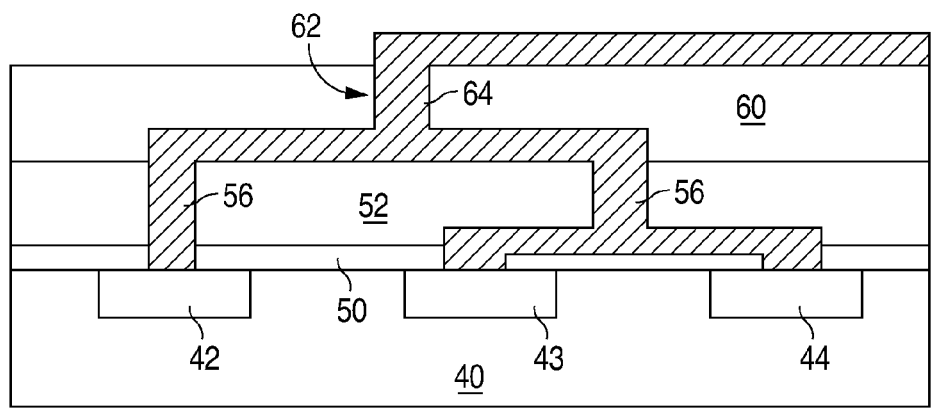
FIG. 17 illustrates the wafer of FIG. 16 after: a) a third dielectric layer is formed with vias; b) the vias are filled with the conductive ink; c) the metal particles are sintered together; and d) a third-tier metal layer is patterned to interconnect the metal in the vias.

FIG. 17 illustrates a third dielectric layer 60 formed with vias 62. The vias 62 are filled with the conductive ink 16 (as previously described), the solvent in the ink 16 is evaporated by a heating step, and the conductive particles 17 are sintered together to form conductive vias 64. A third-tier metal layer 66 is patterned to interconnect the conductive vias 64.

FIGS. 18-24 illustrate additional or alternative methods for forming and using the vias.

Figure 18:
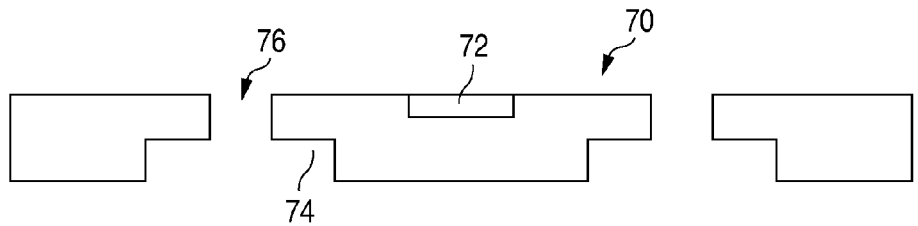
FIG. 18 is a cross-sectional view of a very small portion of a silicon wafer, which may or may not include active components, where partial holes are laser drilled or wet-etched through the back side and smaller, more precise holes are etched through the front side to coincide with the larger holes.

FIG. 18 is a cross-sectional view of a very small portion of a silicon wafer 70. An active component 72, such as a transistor, is shown formed in the front surface at any time in the wafer fabrication process. The component 72 is assumed to require a horizontal metal connection to a vertical via, where the via then provides an electrical connection to another level or another wafer. The component 72 may be formed before or after the via formation process.

At some time in the wafer fabrication process, partial holes 74 are laser drilled through the back side of the wafer 70 using a metal (e.g., chrome) mask formed by photolithography. The holes 74 may instead be wet etched with KOH after a photolithographic masking process. Since the back side of the wafer 70 is generally not used for forming components, it is not vital that the holes 74 be a minimum size. The holes 74 coincide with areas on the front side of the wafer 70 that will have the finely positioned vias.

After a photolithographic masking process, smaller holes 76 are etched through the front side of the wafer 70 that extend to the larger holes 74. Etching may be by RIE etching. Since the holes 74 are large, the alignment is not critical. Forming the back side larger holes 74 reduces the required etching time for the front side holes 76, increases the opening size for the conductive ink to increase the amount of metal particles filling the hole, and reduces the friction between the conductive ink and the walls of the hole. The front side holes 76 may have diameters 2-100 microns.

Figure 19:
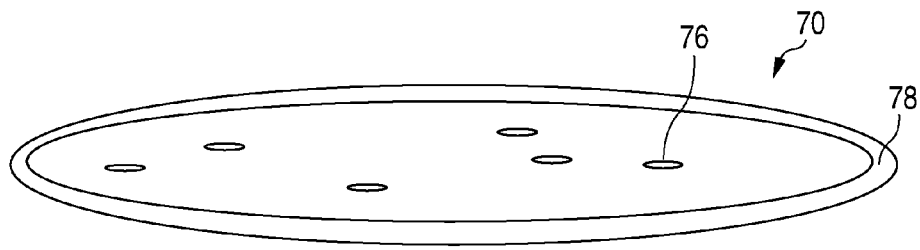
FIG. 19 is a perspective view of the front side of a silicon wafer having a few via holes formed in it. The holes are greatly enlarged for illustration.

Next, the via holes 74/76 are coated with a dielectric, such as oxide, if the wafer material is not already a dielectric. In one embodiment, the wafer 70 is masked and a thermal oxide is grown on the exposed walls of the holes 74/76. FIG. 19 illustrates the resulting wafer 70, showing only a few holes 76 very enlarged for illustration. A perimeter boundary 78 of the wafer 70 is identified.

Figure 20:
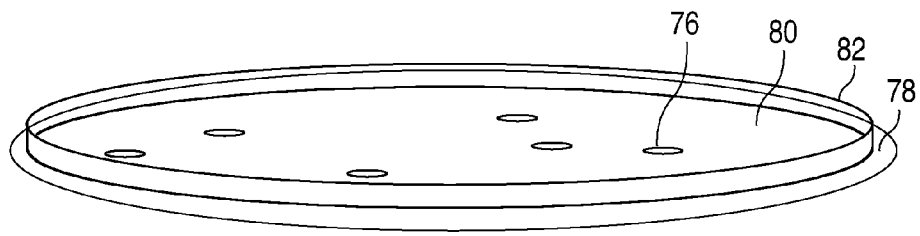
FIG. 20 illustrates the wafer of FIG. 19 having a thin photoresist layer on top, for creating strong hydrophobic behavior, and a thick photoresist perimeter to form a dam.

Next, in FIG. 20, a thin, planar first photoresist layer 80 is formed over the surface of the wafer 70, such as by printing, spinning, spraying, or other process. The holes 76 are exposed through the photoresist such as by a mask that is formed prior to the photoresist deposition, followed by removal of the mask material. Or, the photoresist may be photographically patterned by etching to expose the holes 76.

In another embodiment, the photoresist layer 80 is deposited over the wafer 70 prior to the holes 76 being formed, and the holes 76 are etched by a conventional RIE process along with the overlying photoresist layer 80. Therefore, no alignment between the holes 76 and the photoresist layer holes is needed.

A much thicker photoresist layer is then printed along the boundary 78 to form a wall 82, which will act as a cofferdam for the liquid conductive ink. The height of the wall 82 may only be about 3 millimeters or less, depending on how much conductive ink is needed to fill the holes 74/76.

The photoresist layer 80 is very smooth and exhibits strong hydrophobic (non-wetting) behavior.

Figure 21:
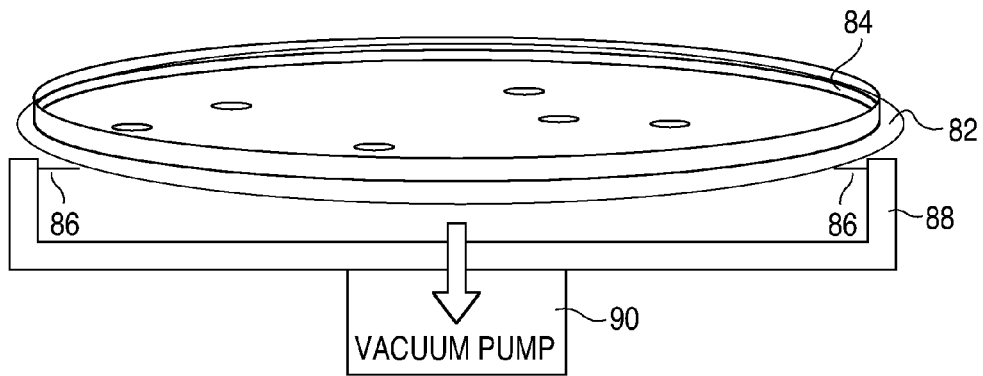
FIG. 21 illustrates the wafer of FIG. 20 after a layer of conductive ink is evenly deposited on the surface, and while a vacuum pump draws the ink into the holes.

Next, as shown in FIG. 21, layer of conductive ink 84 is deposited over the wafer 70. The conductive ink 84 is shown as transparent but is actually translucent due to the metal particles infused in the liquid medium. The ink 84 comprises very small diameter conductive metal particles, such as nickel, aluminum, copper, NiFe, or alloys, suspended in a volatile liquid, such as comprising alcohol, acetone, or other low viscosity organic solvent that evaporates with heat. Water may also be used. The metal particles may be smaller than 1 micron for small diameter holes 76. The metal particles may be formed by grinding the bulk metal, and the average grain size is determined by the fineness of the grinder. Forming metal particles of any size is well known. Spherical nano-nickel powder is commercially available for various uses and preferred due to its low sintering point.

The ink 84 may be deposited by printing, spraying, or any other method to completely cover the surface of the wafer 70 to a certain depth. The metal particles remain suspended due to their small size. There is no reaction between the ink and the photoresist and there is very low friction since the ink 84 does not wet the surface. Suitable conductive inks and non-wettable photoresist materials are commercially available. The weight percentage of the metal particles is somewhat higher than that needed to fully fill the holes 74/76.

Due to the small sizes of the holes 76, the ink 84 requires some force to fill the holes 74/76. Centrifugal force has been discussed above. FIG. 21 illustrates an alternative vacuum process, where the wafer 70 is placed over a fine mesh filter 86, which blocks the metal particles but allows the liquid to pass through. The bottom of the wafer 70 is sealed with respect to the vacuum tool 88. A vacuum pump 90 then pulls the ink 84 into the holes 74/76 until only the metal particles fill the holes 74/76. The liquid that passes through the filter 86 may be recycled.

Figure 22:
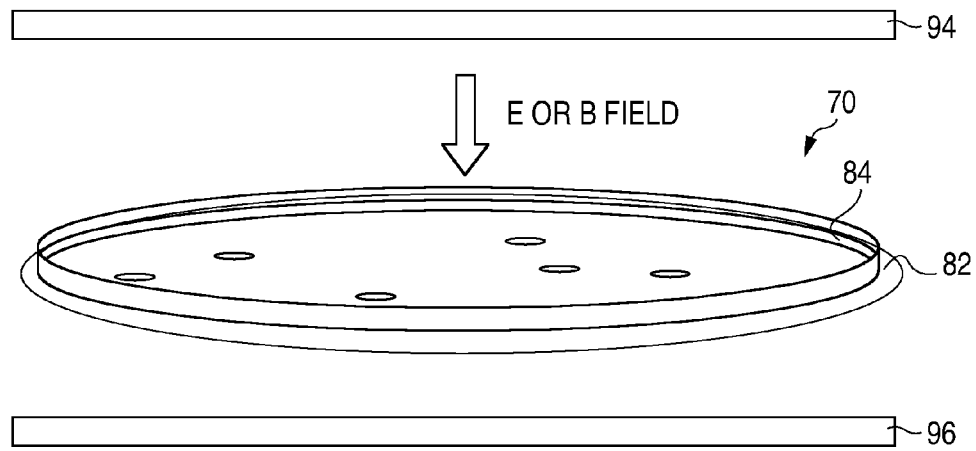
FIG. 22 illustrates the wafer of FIG. 20 after a layer of conductive ink is evenly deposited on the surface, and while an electric or magnetic field draws the ink into the holes.

Alternatively, or in conjunction with the vacuum process, an electric or magnetic field may be created, as shown in FIG. 22. The metal particles may have a NiFe core or be formed of other material with suitable magnetic permeability. If the metal particles are ionized, the electric field will draw the particles into the holes 74/76. A filter prevents the metal particles from exiting the holes. In FIG. 22, the opposing structures 94 and 96 represent metal plates or coils for producing the desired field.

After the process of FIG. 21 or FIG. 22, there will be some ink 84 remaining on the photoresist layer 80 surface.

The wafer 70 is heated, such as by a lamp or in an oven, to evaporate the liquid and sinter the metal particles together. The photoresist layer 80 is then dissolved and removed, thus removing all the excess metal that did not fill the holes 74/76. In the event that sintering results in the metal on the photoresist layer 80 creating a strong bond to the metal in the holes 74/76, the wafer 70 can be heated in a first step to evaporate the liquid, then the photoresist layer 80 is removed prior to the sintering. Therefore, only the metal particles in the holes 74/76 will exist prior to the sintering.

Figure 23:
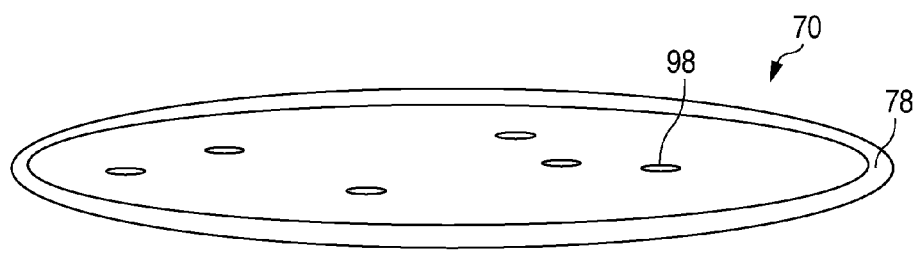
FIG. 23 illustrates the wafer of FIG. 22 or 23 after the wafer is heated to cure the ink, leaving the sintered metal particles filling the holes, and after excess ink is removed from the surface.

FIG. 23 illustrates the top surface of the wafer 70 after the photoresist has been removed. The resulting conductive vias 98 are shown.

The wafer 70 may then complete its processing, such as by forming electrical components in the wafer 70 and performing conventional patterned metallization that connects the components to one another and to the metal vias 98. In one embodiment, the metallization may be performed by printing.

Figure 24:
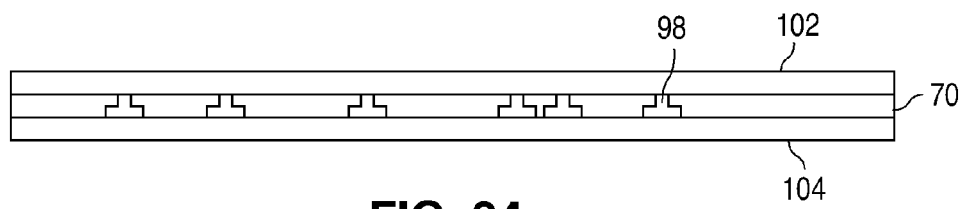
FIG. 24 is a jagged cross-sectional view of the wafer of FIG. 23 serving as an interposer between two wafers with active components.

FIG. 24 is a jagged cross-sectional view of the wafer 70 of FIG. 23 serving as an interposer between two wafers 102 and 104 with active components. The vias 98 vertically interconnect metal layers on the wafers 102 and 104 to create a 3-D structure. Any number of layers of interconnections may be formed using this technique to implement the needed interconnections. Any number of components may be interconnected in any electrical pattern using the above technique. Since the conductive vias and interconnecting metal layers may be formed by printing at atmospheric pressure, the interconnections may be made inexpensively.

In all embodiments, the dimensions of the conductive vias depend on the cost and performance goals for the resulting interconnections. Low cost through-silicon vias may have a diameter of 2-100 microns with a pitch 1-3 times the via diameter and a via depth of 3-10 times the via diameter. High performance vias may have a diameter as small as 1-5 microns with the pitch also 1-3 times the via diameter and the via depth 3-10 times the via diameter. All of these dimensions are envisioned for the embodiments.

The wafers of the various embodiments are then singulated to form dies and packaged using conventional techniques.

The substrate need not be a semiconductor wafer since the process is applicable to forming conductive vias through any material. The vias may even be formed through an oxide layer or other deposited layer on a wafer.

The vias need not be completely filled with the sintered metal particles for there to be a reliable electrical conductive path. For example, the sintered metal particles may just coat the walls of the hole, depending on the size of the hole. As long as there is a continuous electrical path formed by the sintered metal particles, a current will flow with very little resistance.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. An electrical structure comprising:
a hole through a first layer forming part of the electrical structure, the hole being formed between a first surface and an opposite second surface of the first layer;
sintered metal particles within the hole forming a conductive path between the first surface and the second surface, the sintered metal particles remaining from a conductive ink that was deposited over the first surface and heated to sinter the metal particles, the metal particles having diameters including greater than 1 micron, the sintered metal particles forming a conductive via extending between the first surface and the second surface;
a first electrical connection made to a top of the via at the first surface; and
a second electrical connection made to a bottom of the via at the second surface.

2. The structure of claim 1 wherein the first layer comprises a semiconductor.

3. The structure of claim 1 wherein the first layer comprises a semiconductor wafer.

4. The structure of claim 1 wherein the first layer comprises a dielectric.

5. The structure of claim 1 wherein the first layer comprises a single type of material.

6. The structure of claim 1 wherein the first layer comprises at least two layers of dielectric material.

7. The structure of claim 1 wherein the first layer comprises a plurality of layers.

8. The structure of claim 1 wherein the hole comprises a first portion partially through the first layer, and a second portion completing the hole through the first layer, wherein the second portion has a diameter larger than a diameter of the first portion.

9. The structure of claim 1 further comprising electrical components electrically coupled to opposite ends of the conductive path in the via.

10. The structure of claim 1 wherein the hole is less than 10 microns in diameter.

11. The structure of claim 1 wherein a diameter of the hole is such that the conductive ink requires a force greater than gravity to fill the hole.

12. The structure of claim 1 wherein the conductive ink also includes a material with a magnetic permeability to enable the material to be forced into the hole using a magnetic field.

13. The structure of claim 1 wherein at least one of the first electrical connection or the second electrical connection comprises a metal electrode.

14. The structure of claim 1 wherein at least one of the first electrical connection or the second electrical connection comprises a terminal of an electrical component.

15. The structure of claim 1 wherein the hole is a first hole and the conductive via is a first conductive via, the structure further comprising:
- a second hole through a second layer between a third surface and an opposite fourth surface of the second layer;
- sintered metal particles within the second hole forming a conductive path between the third surface and the fourth surface, the sintered metal particles within the second hole remaining from a conductive ink that was deposited over the third surface and heated to sinter the metal particles, the metal particles having diameters including greater than 1 micron, the sintered metal particles forming a second conductive via extending between the third surface and the fourth surface;
- a third electrical connection made to a top of the second conductive via at the third surface; and
- a fourth electrical connection made to a bottom of the second conductive via at the fourth surface, wherein the first conductive via is electrically connected to the second conductive via.

* * * * *